United States Patent
Venkatasubramanian et al.

(10) Patent No.: US 7,235,735 B2
(45) Date of Patent: Jun. 26, 2007

(54) THERMOELECTRIC DEVICES UTILIZING DOUBLE-SIDED PELTIER JUNCTIONS AND METHODS OF MAKING THE DEVICES

(75) Inventors: Rama Venkatasubramanian, Cary, NC (US); Edward P. Siivola, Raleigh, NC (US)

(73) Assignee: Nextreme Thermal Solutions, Inc., Research Triangle Park, NC (US)

( * ) Notice: Subject to any disclaimer, the term of this patent is extended or adjusted under 35 U.S.C. 154(b) by 565 days.

(21) Appl. No.: 10/413,211

(22) Filed: Apr. 15, 2003

(65) Prior Publication Data

US 2003/0230332 A1 Dec. 18, 2003

Related U.S. Application Data

(60) Provisional application No. 60/372,139, filed on Apr. 15, 2002.

(51) Int. Cl.
*H01L 35/04* (2006.01)
(52) U.S. Cl. .................. 136/203; 136/205; 136/212; 62/3.2; 62/3.7
(58) Field of Classification Search ............. 136/203, 136/204, 207, 212; 62/3.2, 3.7
See application file for complete search history.

(56) References Cited

U.S. PATENT DOCUMENTS

| | | | |
|---|---|---|---|
| 3,136,134 A | 6/1964 | Smith | |
| 3,296,034 A | 1/1967 | Reich | |
| 3,607,444 A | 9/1971 | Debucs | |
| 3,663,307 A | * | 5/1972 | Mole ............... 136/204 |
| 4,443,650 A | 4/1984 | Takagi et al. | |
| 5,006,178 A | 4/1991 | Bijvoets | |
| 5,254,178 A | 10/1993 | Yamada et al. | |
| 5,430,322 A | 7/1995 | Koyanagi et al. | |
| 5,837,929 A | 11/1998 | Adelman | |

(Continued)

FOREIGN PATENT DOCUMENTS

EP  0 687 020  12/1995

(Continued)

OTHER PUBLICATIONS

Oct. 9, 2001, RTI International,"New Thermoelectric Materials Can Keep Chips Cool Advances in Fiber Optics and in Biotechnology also are Likely".

(Continued)

*Primary Examiner*—Nam Nguyen
*Assistant Examiner*—Anthony Fick
(74) *Attorney, Agent, or Firm*—Myers Bigel Sibley & Sajovec

(57) ABSTRACT

A thermoelectric device and method of manufacturing the device, where thermoelectric elements of opposite conductivity type are located on respective opposing sides of a heat source member. Heat sinks are disposed on opposite sides of the thermoelectric elements. Peltier metal contacts are positioned between the thermoelectric elements and each of the heat source member and heat sinks. A plurality of devices may be arranged together in a thermally parallel, electrically series arrangement, or in a thermally parallel, electrically parallel arrangement. The arrangement of the elements allow the direction of current flow through the pairs of elements to be substantially the same as the direction of current flow through the metal contacts.

73 Claims, 6 Drawing Sheets

U.S. PATENT DOCUMENTS

| | | | |
|---|---|---|---|
| 5,865,975 | A | 2/1999 | Bishop |
| 5,869,242 | A | 2/1999 | Kamb |
| 5,874,219 | A | 2/1999 | Rava et al. |
| 5,900,071 | A | 5/1999 | Harman |
| 5,922,988 | A | 7/1999 | Nishimoto |
| 6,060,331 | A | 5/2000 | Shakouri et al. |
| 6,060,657 | A | 5/2000 | Harman |
| 6,062,681 | A | 5/2000 | Field et al. |
| 6,071,351 | A | 6/2000 | Venkatasubramanian |
| 6,072,925 | A | 6/2000 | Sakata |
| 6,084,050 | A | 7/2000 | Ooba et al. |
| 6,094,919 | A | 8/2000 | Bhatia |
| 6,154,266 | A | 11/2000 | Okamoto et al. |
| 6,154,479 | A | 11/2000 | Yoshikawa et al. |
| 6,180,351 | B1 | 1/2001 | Cattell |
| 6,271,459 | B1 | 8/2001 | Yoo |
| 6,282,907 | B1* | 9/2001 | Ghoshal ............... 62/3.7 |
| 6,300,150 | B1 | 10/2001 | Venkatasubramanian |
| 6,347,521 | B1* | 2/2002 | Kadotani et al. ......... 62/3.7 |
| 6,365,821 | B1 | 4/2002 | Prasher |
| 6,367,261 | B1* | 4/2002 | Marshall et al. ......... 60/670 |
| 6,384,312 | B1 | 5/2002 | Ghoshal et al. |
| 6,403,876 | B1 | 6/2002 | Ghoshal et al. |
| 6,410,971 | B1 | 6/2002 | Otey |
| 6,412,286 | B1 | 7/2002 | Park et al. |
| 6,505,468 | B2 | 1/2003 | Venkatasubramanian |
| 6,605,772 | B2* | 8/2003 | Harman et al. ......... 136/236.1 |
| 6,696,635 | B2* | 2/2004 | Prasher ............... 136/201 |
| 2001/0052234 | A1 | 12/2001 | Venkatasubramanian |
| 2002/0053359 | A1 | 5/2002 | Harman et al. |
| 2002/0069906 | A1 | 6/2002 | Macris |
| 2002/0139123 | A1 | 10/2002 | Bell |

FOREIGN PATENT DOCUMENTS

| | | |
|---|---|---|
| EP | 0 805 501 | 11/1997 |
| JP | 6-97512 | 4/1994 |
| JP | 06097512 | 4/1994 |
| WO | WO98/43740 | 10/1998 |
| WO | WO98/44562 | 10/1998 |
| WO | WO 00/49664 | 8/2000 |
| WO | WO 01/08800 | 2/2001 |

OTHER PUBLICATIONS

RTI International Annual Report 2001, Turning Knowledge into Practice, pp. 4-37.

Thin-Film Thermoelectric Devices with High Room-Temperature Figures of Merit, Rama Venkatasubramanian et al., Research Triangle Institute, Research Triangle Park, North Carolina 27709, USA, 2001 Macmillan Magazines Ltd., Nature, vol. 413, Oct. 11, 2001, www.nature.com pp. 597-602.

In-situ Monitoring of the Growth of $Bi_2Te_3$ and$Sb_2Te_3$ Films and $Bi_2Te_3$-$Sb_2Te_3$ Superlattice Using Spectroscopic Eillipsometry Hao Cui et al. Journal of Electronic Materials, vol. 30, No. 11 2001, Special Issue Paper, pp. 1376-1381.

Development of 20% Efficient GaInAsP Solar Cells, P,R. Sharps, et al., 1993 IEEE pp. 633-638.

Development of High-Efficiency $Al_{0.2}Ga_{0.8}As$ Solar Cells and Interconnect Schemes For $Al_{0.2}Ga_{0.3}As$/Si Mechanically-Stacked Cascade Cells, Rama Venkatasubramanian, et al., 1993 IEEE pp. 752-756.

Photoreflectance Characterization of InP and GaAs Solar Cells, R.G. Rodrigues et al., 1993 IEEE pp. 681-685.

Close-Packard Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.8}As$ Solar Cells With An Indirect-Bandgap $Al_{0.8}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC; Dec. 5-9, 1994; Hawaii, pp. 1839-1842.

The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al, R. Ahrenkiel et al., First WCPEC; Dec. 5-9, 1994; Hawaii, 1994 IEEE pp. 1692-1696.

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.

Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single- and Poly-Crystalline Substrates, J.A. Hutchby et al., Center for Semiconductor Research, Research Triangle Institute, Research Triangle Park, NC 27709, USA, Solar Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al.,Solid-State Electronics vol. 37, No. 11, pp. 1809-1815, 1994.

Heteroepitaxy and Characterization of Ge-rich SiGe Alloys on GaAs, Rama Venkatasubramanian et al., J. Appl. Phys., vol. 69, No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.

Experimental Evidence of High Power Factors and Low Thermal Conductivity in $Bi_2Te$/$SB_2Te_3$ Superlattice Thin-Films, Rama Venkatasubramanian et al., Research Triangle Institute, Research Triangle Park, NC 27709, USA, 15th International Conference on Thermoelectrics, 1996 IEEE pp. 454-458.

Thermal Conductivity of Si-Ge Superlattices, S.-M. Lee and David G. Cahill[a)], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge And Its Transition to Low-Cost Substrates, Rama Venkatasubramanian et al., 26th PVSC; Sep. 30-Oct. 3, 1997; Anaheim, CA 1997 IEEE. pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi_2Te_3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p152(2), pp. 1-3.

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Strucures, Rama Venkatasubramanian et al., 17th International Conference on Thermoelectrics (1998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, [a)], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI,[1] I.B. Bhat,[1,3] and Rama Venkatasubramanian[2], 1.-Electrical, Computer and Systems Engineering Department, Rensselaer Polytechnic Institute, Troy, NY 12180-3590, USA. 2.-Research Triangle Institute, Research Triangle Park NC 27709, USA, 3.-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001, pp. 1-3.

Cool New Film, Science Update, Oct. 11, 2001, http://www.nature.com/nsu/011011/011011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP_Features_Item/0,260 . . . Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea . . . , Jun. 20, 2002, pp. 1-3.

Supplementary Partial European Search Report, Application No. EP 02 72 5575 Apr. 4, 2006.

Thermal Characterization of $Bi_2Te_3$/$Sb_2Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson [a)], Electronic mail: goodson@vk.standord.edu, Journal of Applied Physics, vol. 90, No. 2, Jul. 15, 2001, pp. 763-767.

Smaller, Faster, Efficient Thermoelectric Cooling, Rama Venkatasubramanian, Technical Insights vol. 30, No. 41, Oct. 17, 2001 ISSN: 0300-757X, pp. 1-2.

CVD Diamond for Components and Emitters, J. Davidson et al., Diamond and Related Materials 10 (2001) pp. 1736-1742.

Sneak Preview, Optical Device Transfers Data Fast, Rama Venkatasubramanian, Design News Dec. 17, 2001. p. 14.

Lattice Thermal Conductivity Reduction and Phonon Localization-like Behavior in Supperlattice Structures, Rama Venkatasubramanian, Research Triangle Institute, Research Triangle Park, North Carolina 27709, Physical Review B, vol. 61, No. 4, Jan. 15, 2000-II, pp. 3091-3097.

Phonon-Blocking Electron-Transmitting Structures, Rana Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 657-686.

RTI Research Yields Major Advance in Thermoelectrics, Rama Venkatasubramanian et al., pp. 8-9.

Cooling Film Termpers Tiny Hot Spots, Rama Venkatasubramanian et al., Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, N.C., Chapter 4, Semiconductors and Semimetals, Vol., pp. 175-201.

Improved Photoluminescence of GaAs in ZnSe/GaAs Heterojunctions grown by Organometallic Epitaxy, S.K. Ghandhi, et al., Electrical Computer, and Systems Engineering Department, Rensselaer Polytechnic Institute, Troy, New York 12180, Appl. Phys. Lett., vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, North Carolina 27709, J. Appl. Phys., vol. 66, No. 11, Dec. 1, 1989, pp. 5662-5664.

Incorporation Processes in MBE Growth of ZnSe, Rama Venkatasubramanian et al., Journal of Crystal Growth 95 (1989) pp. 533-537.

Radiative Recombination in Surface-free $n^+In$ $In^+$ GaAs Homostructures, L.M. Smith and D.J. Wolford et al., Appl. Phys. Lett., vol. 57, No. 15, Oct. 8, 1990, pp. 1572-1574.

Measurement of AlGaAs/AlGaAs interface Recombination Velocities Using Time-Resolved Photoluminescence, M.L. Timmons, et al., Appl. Phys. Lett., vol. 56, No. 19, May 7, 1990, pp. 1850-1852.

Development of Low-Bandgap Ge and $Si_{0.07}Ge_{0.93}$ Solar Cells For Monolithic and Mechanically-Stacked Cascade Applications, Rama Venkatasubramanian et al. 1990 IEEE, pp. 73-78.

Graded-Band-GAP AlGaAs Solar Cells For AlGaAs/Ge Cascade Cells, M.L. Timmons, et al. 1990 IEEE, pp. 68-72.

Photoexcited Carrier Lifetimes and Spatial Transport in Surface-free GaAs Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 319-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1604-1605.

GaInAsP Lattice Matched to GaAs for Solar Cell Applications, P.R. Sharps, et al., Research Triangle Institute, P.O. Box 12194, RTP, NC 27709 1991 IEEE, pp. 315-317.

High-Temperature Performance and Radiation Resistance of High-Efficiency Ge and $Si_{0.07}Ge_{0.93}$ Solar Cells on Lightweight Ge Substrate, Rama Venkatasubramanian et al., pp. 85-98.

An Inverted-Growth Approach To Development Of An IR-Transparent, High-Efficiency AlGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

International Electron Devices Meeting, 1991, Physical Basis and Characteristics of Light Emission From Quantized Planar Ge Structure, Rama Venkatasubramanian, et al., 1991 IEEE pp. 15.4.1-15.4.4.

High Quality GaAs on Si Using $Si_{0.04}Ge_{0.96}$/Ge Buffer Layers, Rama Venkatasubramanian et al., Journal of Crystal Growth 107 (1991) pp. 489-493.

Optimization of the Heteroepitaxy of Ge on GaAs for Minority-Carrier Lifetime, Rama Venkatasubramanian, et al., Journal of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B, vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., Solar Cells, 30 (1991) pp. 345-354.

High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C. Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al., Inst. Phys. Conf. Ser. No. 120: Chapter 9, pp. 401-406.

Properties and Use of Cycled Grown OMVPE GaAs:Zn, GaAs:Se, and GaAs:Si Layers for High-Conductance GaAs Tunnel Junctions, Rama Venkatasubramanian et al., National Renewable Energy Laboratory, Golden, CO 80401, Journal of Electronic Materials, vol. 21, No. 9, 1992, pp. 893-899.

15.8%-Efficient (1-SUN, AM 1.5G) GaAs Solar Cell on Optical-Grade Polycrystalline Ge Substrate, Rama Venkatasubramanian et al., pp. 691-695.

Development of Low-Bandgap Ge and $Sl_{0.07}Ge_{0.03}$ Solar Cells for Monolithic and Mechanically-Stacked Cascade Applications, Rama Venkatasubramanian et al., pp. 73-78.

Fields, S., Proteomics In Genomeland, Science vol. 291 No. 5507 pp. 1221-1224, pp. 1-7.

Graded-Band-GAP AlGaAs Solar Cells For AlGaAs/Ge Cascade Cells, M.L. Timmons, et al., pp. 68-72.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samual K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}As$ Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98.

Physical Basis and Characteristics of Light Emission From Quantized Planar Ge Structures, Rama Venkatasubramanian, et al., pp. 15.4.1-15.4.4.

High Quality GaAs on Si Using $Si_{0.04}Ge_{0.96}$/Ge Buffer Layers, Rama Venkatasubramanian, et al., Journal of Crystal Growth 107 (1991) pp. 489-493.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.

US 6,381,965, 05/2002, Ghoshal (withdrawn)

* cited by examiner

THERMOELECTRIC DEVICES UTILIZING DOUBLE-SIDED PELTIER JUNCTIONS AND METHODS OF MAKING THE DEVICES

CROSS-REFERENCE TO RELATED DOCUMENTS

This application is related to and claims priority under 35 U.S.C. §119(e) to U.S. Provisional Application No. 60/372,139 filed in the United States Patent and Trademark Office on Apr. 15, 2002, the entire contents of which is incorporated herein by reference. This application is related to U.S. Pat. No. 6,300,150 issued Oct. 9, 2001, the entire contents of which is incorporated herein by reference. This application is related to U.S. Pat. No. 6,071,351 issued Jun. 6, 2002, the entire contents of which is incorporated herein by reference. This application is related to U.S. Pat. No. 6,505,468 issued Jan. 14, 2003, the entire contents of which is incorporated herein by reference. This application is also related to U.S. Provisional Application No. 60/253,743, "Spontaneous Emission Enhanced Heat Transport Method and Structures for Cooling, Sensing, and Power Generation", filed Nov. 29, 2000, the entire contents of which is incorporated herein by reference. This application is related to U.S. Provisional Application No. 60/428,753, "Three-Thermal-Terminal ($T^3$) Trans-Thermoelectric Device", filed Nov. 25, 2002, the entire contents of which is incorporated herein by reference.

BACKGROUND OF THE INVENTION

1. Field of the Invention

The present invention relates to a thermoelectric device having a plurality of thermoelements arranged to improve the efficiency and the manufacturability of the thermoelectric device as compared to conventional thermoelectric device arrangements.

2. Discussion of the Background

In U.S. Pat. No. 6,300,150, the entire contents of which is incorporated herein by reference, a thermoelectric device and method for manufacturing the same are disclosed, where a plurality of thermoelements (p, n) are disposed on the same side of a header, as shown in FIG. 6 of U.S. Pat. No. 6,300,150. The surface of the interconnecting members is parallel to the header surface. A cross-section of this device is shown in FIG. 1.

The device includes a plurality of thermoelements that are disposed on the same side of a cooling header. A p thermoelement 13 is connected on one side by metalization 12 to an electrical lead 11 on a first heat sink 10. The Peltier junction metalization (e.g. Cr/Au, Ni/Au, Cr/Au/Ni/Au), is electrically conductive. On the other side p thermoelement 13 is connected to a heat source (i.e., a header) 17 by Peltier junction metalization 16. Element 14 is an ohmic metallization such as Cr/Au and element 15 is a diffusion barrier like Ni. An n thermoelement 19 is connected on one side by Peltier junction metalization 20 to electrical lead 21 on heat sink 10. On the other side n thermoelement 19 is connected to heat source 17 by Peltier junction metalization 16. Element 18 is an ohmic metallization like element 14. The voltage polarities (+,−) are shown for cooling.

There is one heat sink 10 common for both of the p and n thermoelements 13 and 19, and one heat-source (i.e., a header) 17 common to the thermoelements. The n and p elements are intermingled on the same side of header 17 during module fabrication, which can complicate the manufacturing process.

SUMMARY OF THE INVENTION

One object of the present invention is to provide an improved thermoelectric device.

Another object of the present invention is to simplify the manufacture of thermoelectric device.

These and other objects are achieved by a thermoelectric device having a heat source member, a first thermoelectric element of one conductivity type connected to one side of the heat source member, and a second thermoelectric element of a conductivity type opposite to the one conductivity type connected to a side of the heat source member opposite to the one side.

A first heat sink may be attached to the first thermoelectric element, and a second heat sink may be attached to the second thermoelectric element.

Contacts may be made to the first and second thermoelectric devices. The first and second thermoelectric elements may be arranged so that a direction of current flow through the first and second thermoelectric elements is substantially the same as a direction of current flow through the contacts.

The first and second thermoelectric elements may each be a bulk element, a thin film element, or a superlattice element.

The objects of the invention may also be achieved by a thermoelectric device having a first thermoelectric element of a first conductivity type, a second thermoelectric element of a conductivity type opposite to the first conductivity type, and a heat source member disposed between the first and second thermoelectric elements.

Contacts may be formed to the first and second thermoelectric devices, and the first and second thermoelectric elements and the contacts may be arranged so that a direction of current flow through the first and second thermoelectric elements is substantially the same as a direction of current flow through the contacts.

A first heat sink may be attached to the first thermoelectric element, and a second heat sink may be attached to the second thermoelectric device.

The first and second thermoelectric elements may each be a bulk element, thin film element, or a superlattice element.

The objects of the invention may also be achieved by a thermoelectric device having a heat source member, a plurality of first thermoelectric elements of only one conductivity type connected to one side of the heat source member, and a plurality of second thermoelectric element of a conductivity type opposite to the one conductivity type connected to a side of the heat source member opposite to the one side.

A first heat sink may be attached to each of the plurality of first thermoelectric elements, and a second heat sink may be attached to each of the plurality of second thermoelectric elements.

The first and second thermoelectric elements and the contacts may be arranged so that a direction of current flow through respective pairs of the first and second thermoelectric elements is substantially the same as a direction of current flow through the contacts.

The first and second thermoelectric elements may each be a bulk element, a thin film element, or a superlattice element.

The objects of the invention may further be achieved by a method of operating a thermoelectric device having the step of arranging first and second thermoelectric elements on opposite sides of a heat source member such that only elements of one conductivity type are on each one of the sides. Contacts may be arranged between each of the elements and the member such that a current may be caused to flow through respective pairs of the first and second thermoelectric elements in a direction substantially the same as a direction of current flow through the contacts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
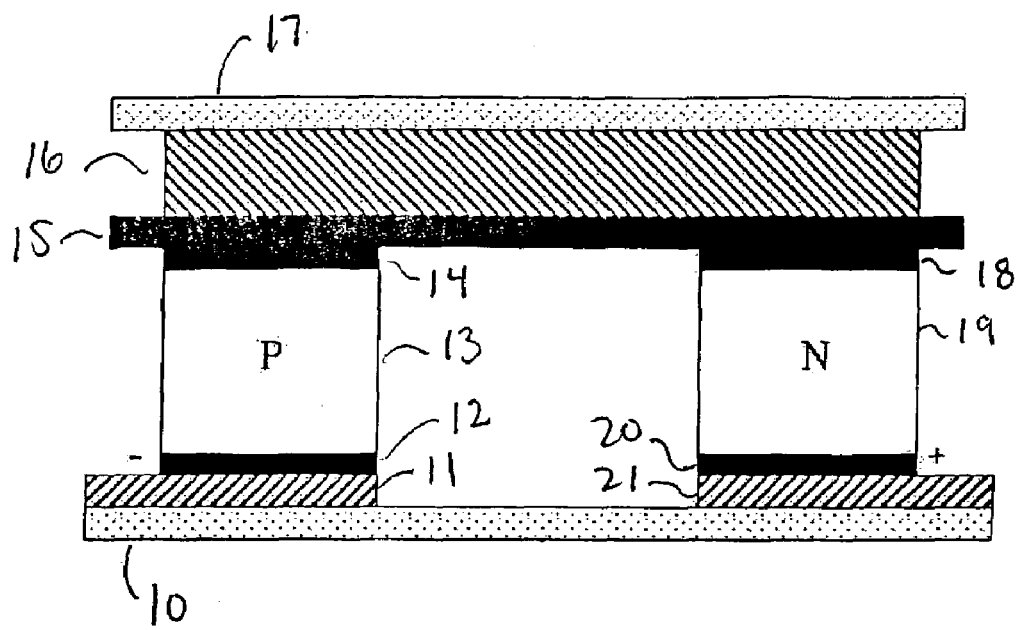
FIG. 1 is a schematic diagram illustrating a conventional thermoelectric device.
Figure 2:
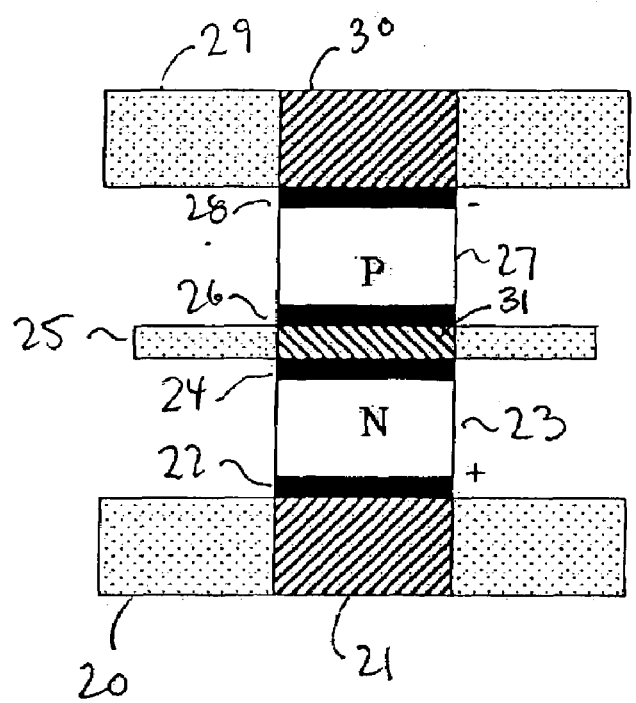
FIG. 2 is a schematic diagram illustrating a thermoelectric device according to the present invention.

Referring now to the drawings, wherein like reference numerals designate identical, or corresponding parts throughout the several views, and more particularly to FIG. 2 thereof, FIG. 2 is a first embodiment of the device according to the present invention. FIG. 2 illustrates a schematic diagram of The device where the voltage polarities (+,−) are shown for cooling. It is noted that the drawing is not to scale, but is drawn to illustrate the features of the device. Dimensions of the elements are discussed below, but the present invention is not limited to those specific dimensiona. The device includes a plurality of thermoelements disposed on opposite sides of a cooling header. A p thermoelement 27 is connected on one side by Peltier junction metalization 28 to an electrical lead 30 on a first heat sink 29. The Peltier junction metalization is electrically conductive. On the other side, p thermoelement 27 is connected to a contact 31 on heat source (header) 25 by Peltier junction metalization 26. An n thermoelement 23 is connected on one side by Peltier junction metalization 22 to electrical lead 21 on heat sink 20. The other side of n thermoelement 23 is connected to contact 31 on heat source 25 by Peltier junction metalization 24.

N and p thermoelements are thin films of thickness in the range of microns to tens of microns, grown or deposited or transferred on a substrate using techniques such as metallorganic chemical vapor deposition (MOCVD), chemical vapor deposition (CVD), molecular beam epitaxy (MBE) and other epitaxial/non-epitaxial processes. The thin films can consist of thin-film superlattice or non-superlattice thermoelectric materials, quantum-well (two-dimensional quantum-confined) and quantum-dot (three dimensional quantum-confined type) structured materials, and non-quantum-confined materials. Also, materials that are peeled from bulk materials can also be used.

The advantage of having p and n thermoelements 13 and 19 on opposite sides of the header 17 is that it simplifies the arrangement of all p elements on one side of the heat source header and correspondingly the n elements on the opposite side of the heat source header.

Figure 3:
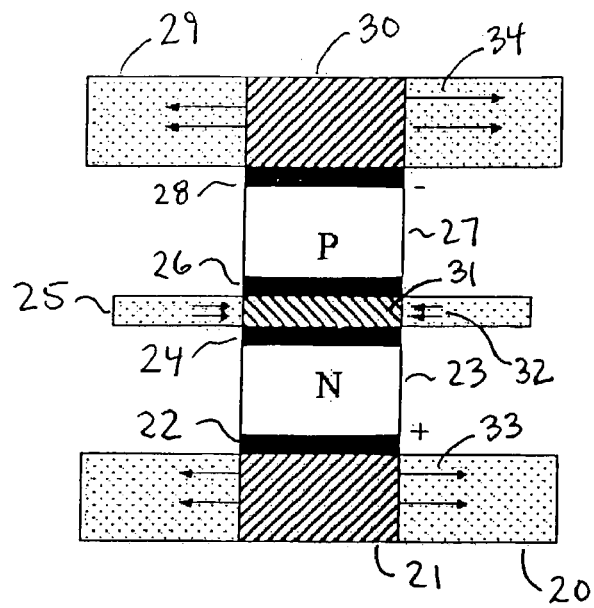
FIG. 3 is a schematic diagram illustrating heat flow in the thermoelectric device according to the present invention.

The energy from heat source 25 is interfaced/communicated to the Peltier junction. This can be achieved by flow of air or other high-thermal transfer-coefficient liquids such as for example water or fluorocarbon fluids. This is shown in FIG. 3. Heat is absorbed (shown schematically by arrows 32) in parallel from, for example, the heat source fluids at the Peltier junction formed by metalizations 24 and 26. The heat deposited in parallel on headers 20 and 29 is removed (shown schematically by arrows 33 and 34, respectively). In this arrangement of FIG. 3, the current flows from metal 28, through p thermoelement 27, through the Peltier junctions, through n thermoelement 23 to metal 22. The p thermoelement 27 may be made of a p type material such as a $Bi_2Te_3/Sb_2Te_3$ superlattice or Si/Ge superlattice and the n thermoelement 23 may be made of an n type material such as a $Bi_2Te_3/Bi_2Te_{3-x}Se_x$ superlattice or a Si/Ge superlattice. Other suitable superlattices of thermoelectric materials having alternating lattice constants between the individual superlattice layers could be used, according to the present invention.

The arrangement according to the invention avoids the problem of intermingling n and p elements on the same side of the header as discussed in U.S. Pat. No. 6,300,150. This avoidance can lead to substantial advantages in assembly of p and n thermoelements, to produce a p-n couple and in turn a full-scale module. This can also lead to more convenient use of large-scale wafers as well. For example, the deposition of a similar type thermoelectric material, the patterning of the deposited thermoelectric materials, and subsequent metallization can occur on the same thermoelectric device wafer. The device wafer, if of a suitable thermal conductivity, could compose the header itself. Otherwise, the deposited device layers could be removed from the device wafer and bonded on the header.

Figure 4:
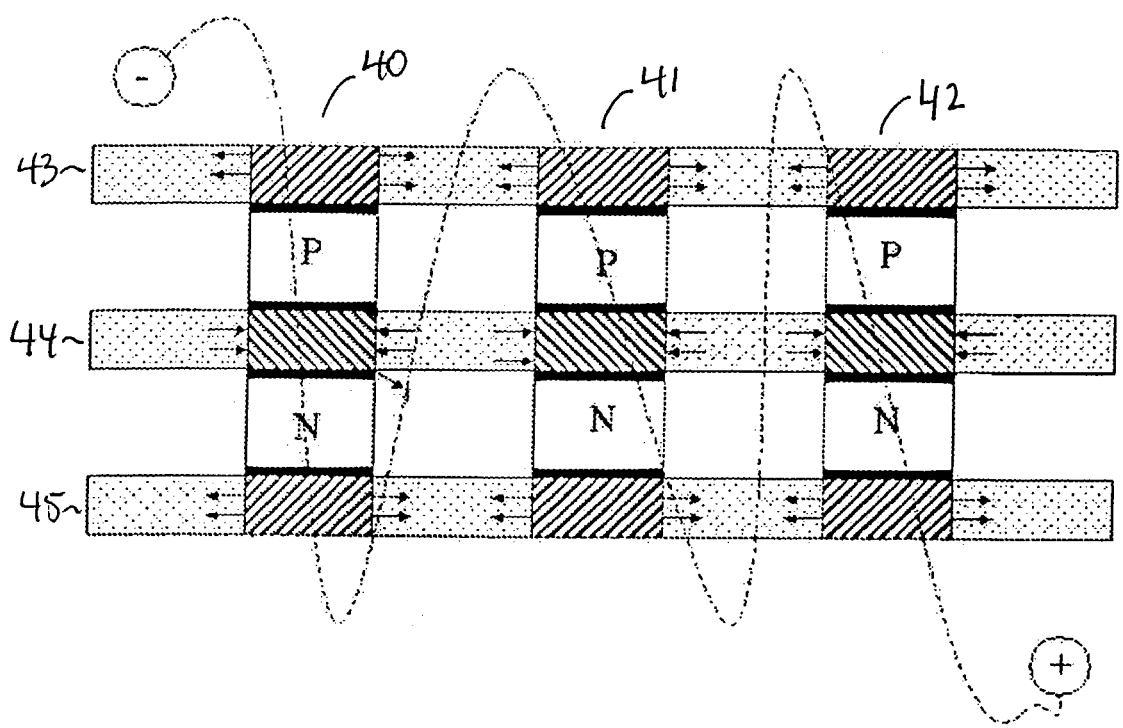
FIG. 4 is a schematic diagram of a thermally parallel, electrically series thermoelectric module according to the present invention.

The thermoelements may be arranged in a number of configurations to form modules. One example is shown in FIG. 4 where a thermally parallel, electrically series double-sided Peltier junction module is illustrated. Three thermoelectric devices 40, 41 and 42, with elements of the same conductivity type formed on the same side of the header, are connected to heat source 44 and heat sinks (headers) 43 and 45. The movement of heat is schematically shown by the arrows. The (+,−) arrangement is shown for cooling.

Figure 5:
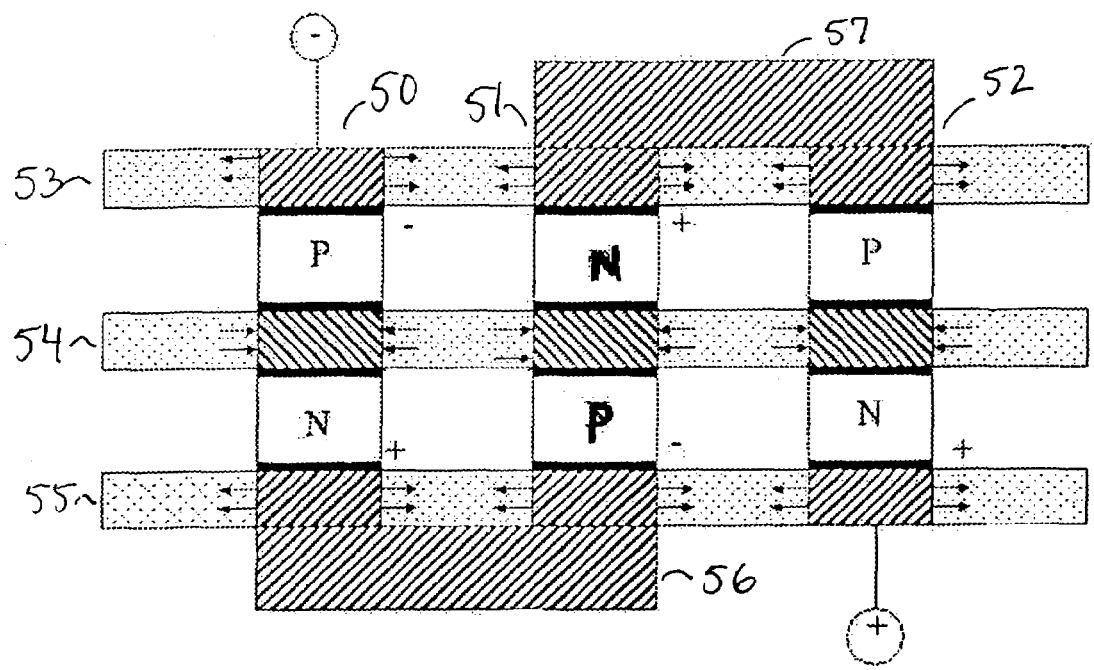
FIG. 5 is a schematic diagram of a thermally parallel, electrically series thermoelectric module according to the present invention.

Another example of a thermally parallel, electrically series double-sided Peltier junction module is illustrated in FIG. 5. The module includes thermoelectric devices 50, 51 and 52 connected to heat source (header) 54 and heat sinks (headers) 53 and 55. Heat transfer is shown by the arrows. Note the orientation of the n and p elements of the devices, relative to the headers, is alternated. Thus this "intermingled" configuration the n-element of device 50 is connected to is an extension of the conventional p, n on same side of header with the double side Peltier junction concept proposed in FIG. 4 p-element of device 51 by interconnect 56, and the n-element of device 51 is connected to the p-element of device 52 by interconnect 57. Here, the electrical leads 56 and 57 provide the electrical interconnection between adjacent devices. Note that these electrical leads or interconnects can be routed through compact coaxial electrical jigs at headers 53 and 55, if desired. The electrical routing is simpler than in the module of FIG. 4. Further, in some cases, these electrical leads can be used as "radiators" of heat as long as the electrical leads are on the heat-sink side. See for example U.S. patent application Ser. No. 10/169,721, the entire contents of which are incorporated herein by reference.

One potential advantage of this thermally parallel, electrically series thermoelectric module as shown in FIG. 5 compared to the single-side Peltier junction, thermally parallel, electrically series thermoelectric module, described in U.S. Pat. No. 6,300,150, is that the interconnect resistance at the Peltier junction can be significantly reduced. The reduction of interconnect resistance comes from the fact that, in this present invention, the current flowing through Peltier metalization is along the direction of current flow through the thermoelement. This can be understood from the fact that it is easier to reduce resistance in a vertical direction compared to a lateral direction.

Figure 6:
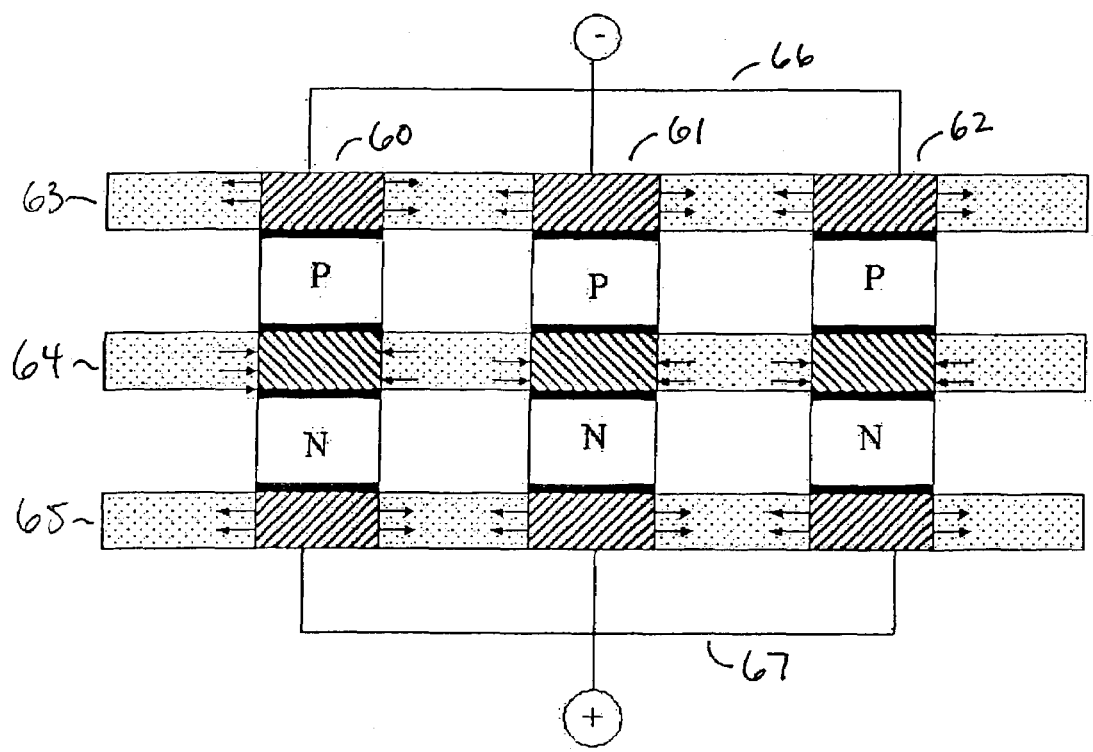
FIG. 6 is a schematic diagram of a thermally parallel, electrically parallel thermoelectric module according to the present invention.

A thermally parallel, electrically parallel, double-sided Peltier junction module is shown in FIG. 6. Devices 60, 61 and 62 are connected to heat sinks (headers) 63 and 65 and heat source (header) 64. The heat flow is shown by the arrows. Each of the p-elements of devices 60–62 is connected to interconnect 66 and each of the n-elements of devices 60–62 is connected to interconnect 67. This arrangement could be useful especially for low-T (low cooling temperature requirements or low heating temperature requirement from ambient) systems as the current requirements are lower. Lower current requirements can be met with parallel confirmation of devices, as here however, the electrical routing is also significantly simpler compared to the device of FIG. 4.

Figure 7:
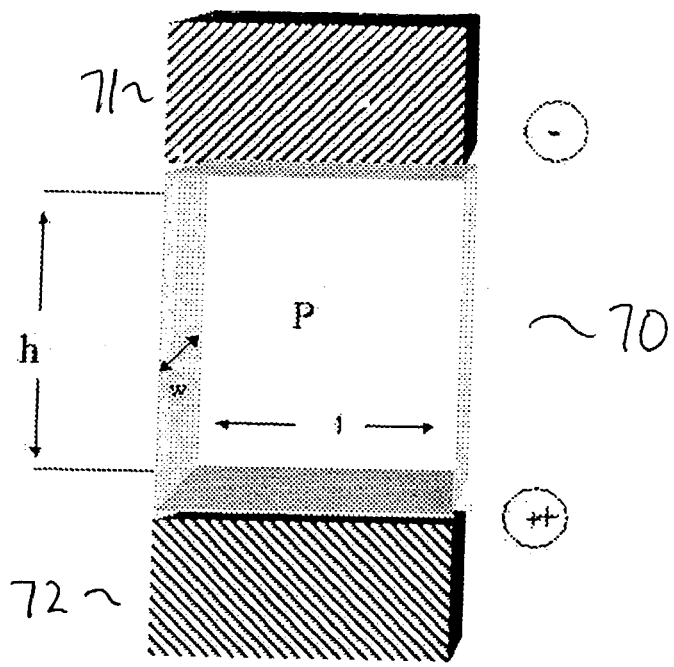
FIG. 7 is a schematic diagram illustrating dimensions of the thermoelectric device according to the present invention.

Preferably, the p- and n-thermoelements are made of bulk or thin film materials. The devices can be of any dimension to suit the application. FIG. 7 illustrates in general the dimensions of a thermoelement. In FIG. 7, a p-thermoelement 70 is connected between contacts 71 and 72. For thin film devices, 1 is in the range of approximately 1.0 µm to 1000 µm, w is in the range of approximately 10 µm to 1000 µm, and h is in the range of approximately 1.0 µm to 1000 µm. For bulk device, 1, h and w are each typically 1 mm. The elemental dimensions for an n-thermoelement are expected to be similar to those for a p-thermoelement, depending on the figure-of-merit (ZT), thermal conductivity (K) and other parameters such as Seebeck coefficient ($\propto$) and electrical conductivity ($\sigma$) of the n and p elements as described in Venkatasubramanian et al., Nature, vol. 413, pp. 597–602 (Oct. 11, 2001), the entire contents of which are incorporated herein by reference. Note circular cross sections and other cross-sections of thermoelements can also be used although rectangular cross-sections as shown here.

Note the dimensions 1 and w of the thermoelements in FIGS. 4–6, the depth of the heat-source plate, and corresponding dimensions of the heat-sink plate can be designed to optimize the heat transfer coefficients. For example, the height of Peltier metalizations 71 and 72, as shown in FIG. 7, can be made different from the height of the heat-source plate, for better heat transfer (e.g. height of element 71≅heights of elements 28 and 30 combined, and the height of element 72≅heights of elements 22 and 31 combined). For example, larger heights of the heat source plate can lead to easier fluid flow (though channels having a height of the Peltier metal in the heat source plate) while a smaller height of the Peltier metalization can lead to lower electrical resistance of Peltier metalization.

Figure 8:
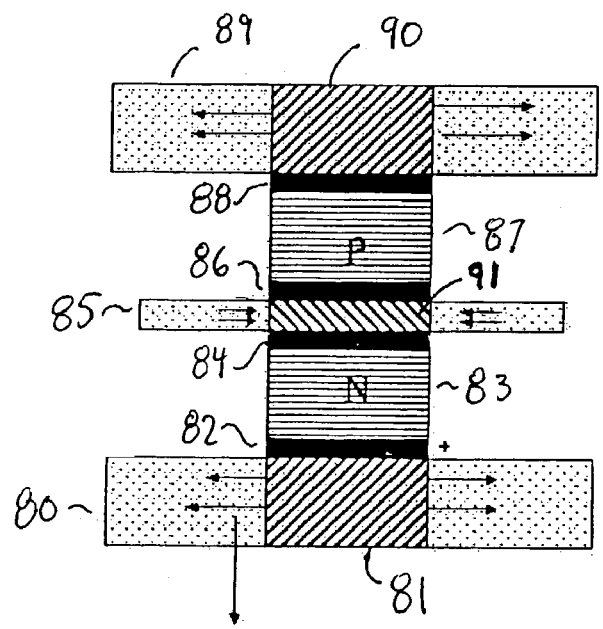
FIG. 8 is a schematic diagram of a superlattice thermoelectric device according to the invention according to the present invention.

Another example of the n- and p-thermoelements according to the invention is shown in FIG. 8. N-thermoelement 83 is a superlattice thermoelement (schematically shown by the parallel lines) is connected to electrical lead 81 of heat sink (header) 80 by Peltier metalization 82 and to electrical lead 91 of heat source (header) 85 by Peltier metalization 84. P-thermoelement 87 is a superlattice thermoelement connected to electrical lead 90 of heat sink (header) 89 by Peltier metalization 88 and to electrical lead 91 of heat source (header) 85 by Peltier metalization 86. Note that in the superlattice n- and p-thermoelements, the current flow is perpendicular or approximately perpendicular through the superlattice interfaces. The current continues in the same direction through the Peltier junction metalization, while going from the p-thermoelement to the n-thermoelement. Superlattice thermoelements may be used in any arrangement, such as in FIGS. 4–6.

The device according to the invention is able to the lower the Peltier junction metalization resistance, and can achieve effective heat transfer between the working (heat-transfer) fluids and the Peltier junction metalization without significant losses. Effectively, the radiative and convective heat loses can be reduced with the double-sided Peltier junction structure. The p and n thermoelements can also be quantum-confined structures or quantum-dot superlattice materials. These materials may also be arranged in numerous configurations such as shown in FIGS. 4–6. The thermoelectric device according to the invention may be used with thermal spreaders/plates such as AlN, $Al_2O_3$, diamond, BeO, or other materials with good thermal conductivity. This device according to the invention can also be combined with cascading or multi-stage thermoelectric cooler concepts. See for example U.S. Pat. No. 6,505,468, the entire contents of which are incorporated herein by reference.

Besides cooling, these devices may be applied for power conversion as well. In FIGS. 1–8, heat will be absorbed in the heat-source plate, which is hotter than the heat-sink plate, and deposited at the heat-sink plate, thereby producing an external current. This is in contrast to the arrangement where an external power source providing a current source to the cooler or heater when the thermoelectric device is operated in that mode.

Figure 9:
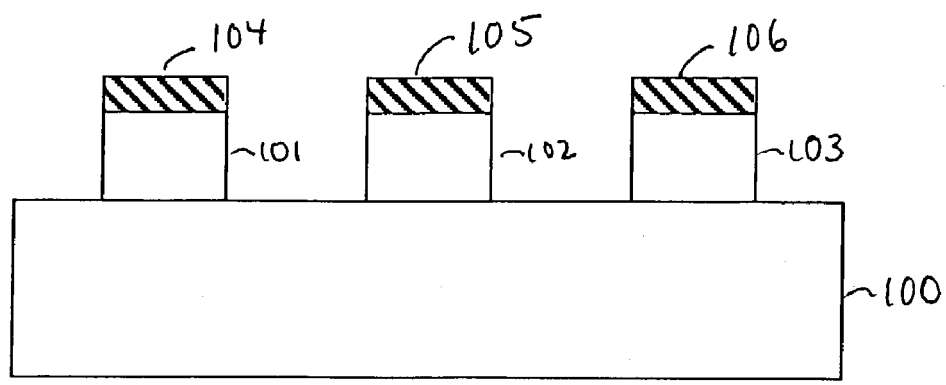
FIG. 9 is a cross-sectional diagram illustrating the manufacture of a thermoelectric module according to the present invention.
Figure 10:
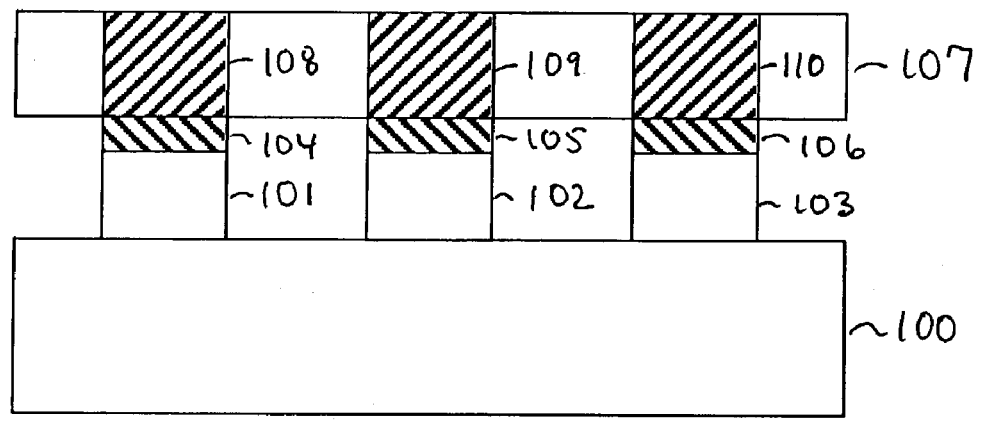
FIG. 10 is a cross-sectional diagram illustrating the manufacture of a thermoelectric module according to the present invention.

These devices may be manufactured as shown in FIGS. 9–13. The manufacturing techniques described in U.S. Pat. No. 6,300,150 may be applied and/or adapted for use in manufacturing the devices according to the invention. In FIG. 9, a cross-sectional view of a substrate 100 having thermoelectric elements 101–103 with corresponding Peltier metalizations 104–106 is shown. The thermoelements may be n- or p-type, and may be bulk, thin film or superlattice type elements. The thermoelements are formed using the techniques described typically as a layer on substrate 100. A layer of Peltier metalization may then be formed on the layer. The individual elements 101–103 are formed using standard patterning techniques, such as photolithography and etching to desired dimensions. The elements may be formed in any pattern, such as a matrix.

Figure 11:
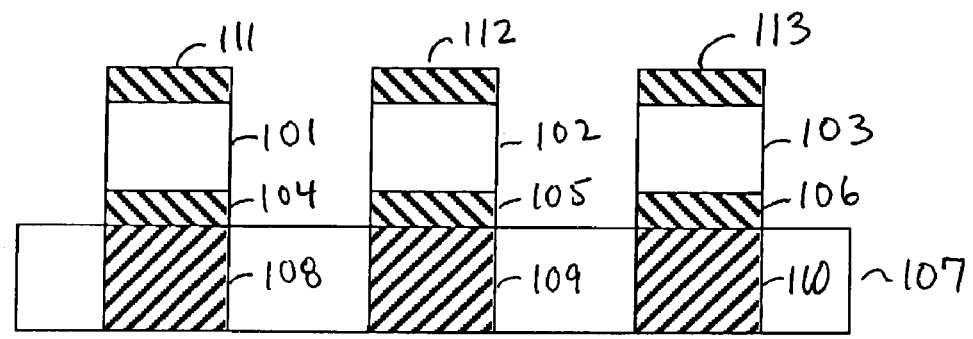
FIG. 11 is a cross-sectional diagram illustrating the manufacture of a thermoelectric module according to the present invention.

A heat sink (cooling header) 107 having a pattern of connections including connections 108, 109 and 110 is attached to the elements through the Peltier metalizations 104–106. The connections 108–110 and metalizations 104–106 form electrical contacts having as low as possible resistance. The connections on header 107 form a pattern to provide connections to and/or interconnect the thermoelements as desired. The substrate is then removed, as shown in FIG. 11, and a second Peltier metalization, forming metalizations 111, 112 and 113, is formed on the side of thermoelements from which the substrate 100 was removed. Alternatively, at least some of the thermoelements may be directly deposited on the header 107. In a preferred embodiment of the present invention, a substrate on which a thermoelectric material is deposited or which is being etched is maintained at a lower temperature than a precursor (e.g. a metal-organic) cracking temperature by deposition in an apparatus which includes a susceptor with separators, made of an optically transmissive material with low thermal conductivity, such as quartz, upon which the substrates are mounted. The susceptor is heated to a precursor cracking temperature while the substrates are maintained at a lower deposition temperature by the separators. The substrates are heated by black body radiation transmitted through the separators to the substrates. By methods such as those disclosed in the above-noted U.S. Pat. No. 6,071,351, the thermoelectric material can be deposited on a header. The header, according to the present invention, can include a semiconductor wafer itself, and by these low temperature techniques can be a processed semiconductor wafer containing integrated or power switching devices.

Figure 12:
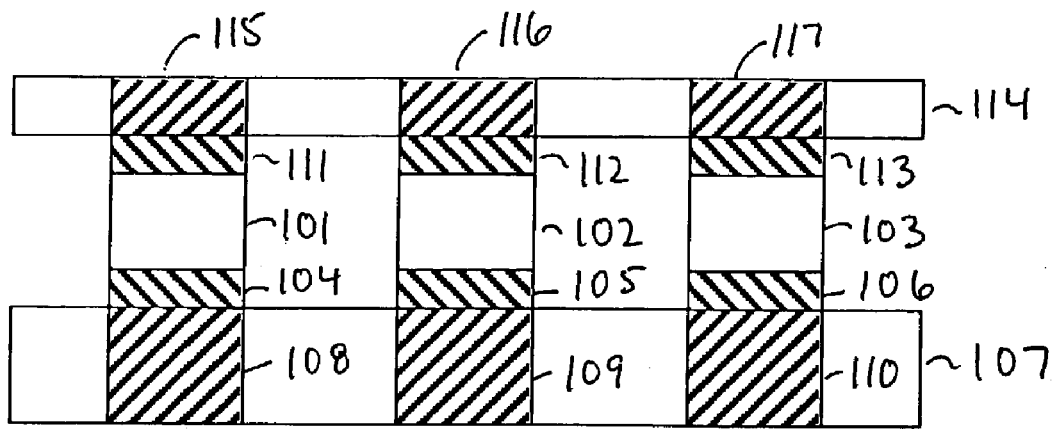
FIG. 12 is a cross-sectional diagram illustrating the manufacture of a thermoelectric module according to the present invention.

A heat source (header) 114 having connections 115, 116 and 117 is then attached through the metalizations 111–113 to the thermoelements as shown in FIG. 12. The connections in the header 114 are arranged in a desired pattern to connect the thermoelements 101–103 to thermoelements that are to be arranged on the other side of header 114.

Figure 13:
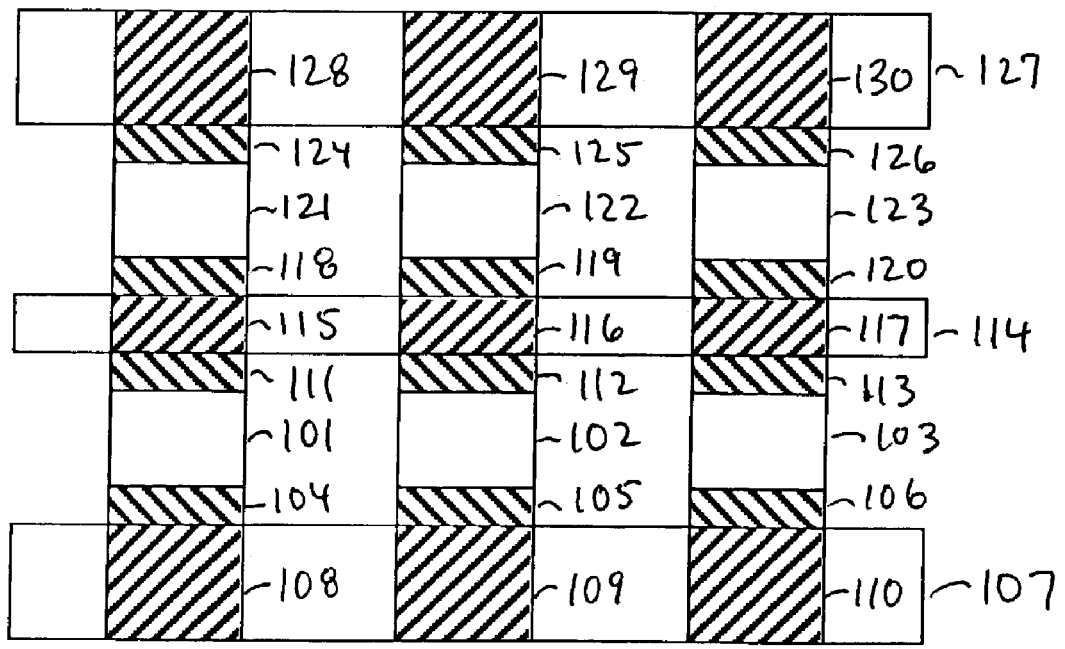
FIG. 13 is a cross-sectional diagram illustrating the manufacture of a thermoelectric module according to the present invention.

Another set of thermoelements, having an opposite conductivity type to thermoelements 101–13 are prepared in the same manner as described above in FIGS. 9–11. As shown in FIG. 13, a second set of thermoelements 121, 122 and 123 are attached to contacts 128, 129 and 130 of a heat sink (header) 127 through Peltier metalization 124, 125 and 126. The thermoelements 121–123 are attached to connections 115–117 of header 114 through Peltier metalizations 118, 119 and 120. Alternatively, at least some of the thermoelements and the Peltier metallization may be directly deposited on the header 127. Different patterns of connections in the headers can produce a series or parallel electrical connection of the thermoelements.

Additionally, the present invention can utilize for the thermoelectric devices a transthermistor employing a unipolar p—p or n—n couple with two electrical terminals and three temperature terminals to achieve a very large temperature differential across each end of a unipolar couple, as described in the above-noted U.S. Provisional Application No. 60/428,753. For example, a p—p transthermistor unipolar couple can be used in conjunction with an n—n transthermistor unipolar couple for ease of integration into a modular device although a complete module can be constructed with a set of p—p or n—n unipolar transthermistor couples. The advantages of this unipolar transthermistor device include the use of only one type of polarity elements like p-type or n-type thermoelements, whichever has higher ZT. Current is driven in opposite directions through the pairs of unipolar elements to establish a temperature differential across each of the unipolar element pairs. For example, in the present invention, modules can be constructed using only p-type $Bi_2Te_3/Sb_2Te_3$ superlattice thermoelements with a ZT of ~2.5 at 300K, rather than combining with n-type $Bi_2Te_3$-based superlattice thermoelements with a ZT of ~1.2 to 1.9 at 300K to form a conventional p-n couple. Alternatively, the present invention can use only n-type PbTeSe/PbTe quantum-dot superlattice thermoelements with a ZT of ~1.6 at 300K, rather than combining with p-type PbTe-based superlattice thermoelements with a much lower ZT at 300K. In this approach, the thermoelement 27 depicted in FIG. 2 is constructed to be a n-type thermoelement, and current can be driven in opposite directs through thermoelements 27 and 23 to ensure cooling to the heat source 25.

Numerous applications are available for the double-sided Peltier junction devices of the present invention. These applications include not only cooling applications near room temperature (e.g., replacement of compression-based cooling engines in refrigerators and air conditioning units and other cooling devices, replacement or augmentation of forced air cooling in semiconductor IC and power device thermal management, and replacement or augmentation of liquid phase change cooling, etc.) but extends to cryogenic cooling applications as well. For example, one application of the present invention is in the cooling superconducting coils found in electric motors and generators. In this case, thermoelectric devices of the present invention are placed in thermal contact with the superconducting coils. Thermal contact to the superconducting coils accomplished similar to those techniques disclosed in U.S. Pat. No. 6,505,468. Large power industrial motors and generators can benefit significantly from the use of superconducting coils. The application of superconducting coils to industrial motors and generators would reduce substantially the rotor ohmic losses (i.e., $I^2R$). The reduction in $I^2R$ loss would more than compensate for the extra power required for refrigeration of the superconducting coils. While some high-temperature superconductors are superconducting at liquid nitrogen temperatures of 77 K, in the presence of magnetic fields (such as in electric motors or generators), the current carrying ability of these liquid nitrogen superconductors is deteriorated. Thus, more expensive liquid helium (at temperatures of 4.2 K) is utilized to keep the superconducting coils at 30 to 50 K, where in the presence of a magnetic field the current carrying capability is not deteriorated.

More specifically, the double-sided Peltier junction devices of the present invention could be utilized to in thermal contact with the backside of an integrated circuit chip or a power switching device as a cooling or power header. The backside, especially if it is electrically conducting, needs to be suitably modified to confine the electrical current to the thermoelectric element. One example of suitable preparation is p-n junction isolation in the backside of the chip whereby the current is made to flow through the intended thermoelectric electric elements, i.e. is confined to the elements, and is not shunted by the conducting backside of the chip. Other modifications of the backside are possible to achieve similar confinement of the current. The backside then may be used to extract heat which could be used for other purposes such as power generation. For example, the power generated using the heat could be used provide power to other circuits or to other cooling devices.

Alternatively, the backside or the frontside of the integrated circuit chip or a semiconductor power switching device could be thermally connected to the double-sided Peltier junction devices of the present invention.

Numerous modifications and variations of the present invention are possible in light of the above teachings. It is therefore to be understood that within the scope of the appended claims, the invention may be practiced otherwise than as specifically described herein.

The invention claimed is:

1. A thermoelectric device, comprising:
a heat source member;
a first thermoelectric element of one conductivity type connected to one side of said heat source member;
a second thermoelectric element of a conductivity type opposite to said one conductivity type connected to a side of said heat source member opposite to said one side;
a third thermoelectric element connected to said one side of said heat source member;
a fourth thermoelectric element connected to said side of said heat source member opposite to said one side; and
an electrical connection in the heat source member wherein the electrical connection provides electrical connection between the first thermoelectric element and one of the second or fourth thermoelectric elements.

2. The device of claim 1, further comprising:
a first heat sink attached to said first thermoelectric element; and
a second heat sink attached to said second thermoelectric element.

3. The device of claim 1, further comprising:
a first metal contact formed on said first thermoelectric element and connected between said first thermoelectric element and said electrical connection in the heat source member; and
a second metal contact formed on said second thermoelectric element and connected between said second thermoelectric element and said electrical connection in the heat source member.

4. The device of claim 3, wherein the electrical connection comprises a third contact formed in said heat source member and connected to said first and second metal contacts.

5. The device of claim 3, wherein each of said first and second metal contacts comprises a Peltier metal contact.

6. The device of claim 3, further comprising:
a first heat sink attached to said first thermoelectric element;
a second heat sink attached to said second thermoelectric element;
a third metal contact formed on said first thermoelectric element and connected between said first thermoelectric element and said first heat sink; and
a fourth metal contact formed on said second thermoelectric element and connected between said second thermoelectric element and said second heat sink.

7. The device of claim 3, wherein said first and second thermoelectric elements and said first and second metal contacts are arranged so that a direction of current flow through said first and second thermoelectric elements is substantially the same as a direction of current flow through said first and second metal contacts.

8. The device of claim 1, wherein at least one of said first and second thermoelectric elements comprises one of a bulk element, a thin film element, and a superlattice element.

9. The device of claim 8, wherein said superlattice element comprises at least one of a $Bi_2Te_3/Sb_2Te_3$ superlattice and a Si/Ge superlattice.

10. The device of claim 8, wherein said superlattice element comprises layers of differing thermoelectric materials arranged parallel to the heat source member and having a ZT greater than 1.

11. The device of claim 1, wherein at least one of said first and second thermoelectric elements comprises one of a quantum-well material and a quantum-dot structured material.

12. The device of claim 1, wherein said heat source member is thermally connected to a heat exchanger in at least one of a refrigerating unit and an air conditioning unit.

13. The device of claim 1, wherein said heat source member is thermally connected to a superconducting element.

14. The device of claim 1, wherein said heat source member is thermally connected to at least one of an integrated circuit and a semiconductor power switching device.

15. The device of claim 1 wherein said third thermoelectric element is of said conductivity type opposite to said one conductivity type, and wherein said fourth thermoelectric element is of said one conductivity type.

16. The device of claim 1 wherein said fourth thermoelectric element is of said conductivity type opposite to said one conductivity type, and wherein said third thermoelectric element is of said one conductivity type.

17. The device according to claim 1 wherein the electrical connection provides electrical connection through the heat source member.

18. The device according to claim 1 wherein the electrical connection comprises a first electrical connection between the first and second thermoelectric elements, the device further comprising:
a second electrical connection in the heat source member wherein the second electrical connection provides electrical connection between the third and fourth thermoelectric elements, wherein portions of the heat source member are between the first and second electrical connections.

19. The device according to claim 1 wherein the electrical connection comprises a first electrical connection between the first and fourth thermoelectric elements, the device further comprising:
a second electrical connection in the heat source member wherein the second electrical connection provides electrical connection between the second and third thermoelectric elements, wherein portions of the heat source member are between the first and second electrical connections.

20. A thermoelectric device comprising:
a first thermoelectric element of a first conductivity type;
a second thermoelectric element of a conductivity type opposite to said first conductivity type;
a third thermoelectric element of said first conductivity type;
a fourth thermoelectric element of said conductivity type opposite to said first conductivity type;
a heat source member disposed between said first and second thermoelectric elements and between said third and fourth thermoelectric elements; and
an electrical connection in the heat source member wherein the electrical connection provides electrical connection between the first and second thermoelectric elements.

21. The device of claim 20, further comprising:
a first metal contact formed on said first thermoelectric element contacting said first thermoelectric element and said electrical connection in the heat source member; and
a second metal contact formed on said second thermoelectric element contacting said second thermoelectric element and said electrical connection in the heat source member.

22. The device of claim 21, wherein the electrical connection comprises a third contact formed in said heat source member and connected to said first and second metal contacts.

23. The device of claim 21, wherein said first and second metal contacts each comprises a Peltier metal contact.

24. The device of claim 21, further comprising:
a first heat sink attached to said first thermoelectric element;
a second heat sink attached to said second thermoelectric element;
a third metal contact formed on said first thermoelectric element and connected between said first thermoelectric element and said first heat sink; and
a fourth metal contact formed on said second thermoelectric element and connected between said second thermoelectric element and said second heat sink.

25. The device of claim 21, further comprising:
said first and second thermoelectric elements and said first and second metal contacts arranged so that a direction of current flow through said first and second thermoelectric elements is substantially the same as a direction of current flow through said first and second metal contacts.

26. The device of claim 20, comprising:
a first heat sink attached to said first thermoelectric element; and
a second heat sink attached to said second thermoelectric element.

27. The device of claim 20, wherein said first and second thermoelectric elements each comprises one of a bulk element, a thin film element, and a superlattice element.

28. The device of claim 20, wherein at least one of said first and second thermoelectric elements comprises one of a bulk element, a thin film element, and a superlattice element.

29. The device of claim 28, wherein said superlattice element comprises at least one of a $Bi_2Te_3/Sb_2Te_3$ superlattice and a Si/Ge superlattice.

30. The device of claim 28, wherein said superlattice element comprises layers of differing thermoelectric materials arranged parallel to the heat source member and having a ZT greater than 1.

31. The device of claim 20, wherein at least one of said first and second thermoelectric elements comprises one of a quantum-well material and a quantum-dot structured material.

32. The device of claim 20, wherein said heat source member is thermally connected to a heat exchanger in at least one of a refrigerating unit and an air conditioning unit.

33. The device of claim 20, wherein said heat source member is thermally connected to a superconducting element.

34. The device of claim 20, wherein said heat source member is thermally connected to at least one of an integrated circuit and a semiconductor power switching device.

35. The device of claim 20 wherein the first and third thermoelectric elements are on a first side of the heat source member, and the second and fourth thermoelectric elements are on a second side of the heat source member opposite the first side.

36. The device of claim 20 wherein the first and fourth thermoelectric elements are on a first side of the heat source member, and the second and third thermoelectric elements are on a second side of the heat source member opposite the first side.

37. The device according to claim 20 wherein the electrical connection provides electrical connection through the heat source member.

38. The device according to claim 20 wherein the electrical connection comprises a first electrical connection between the first and second thermoelectric elements, the device further comprising:
a second electrical connection in the heat source member wherein the second electrical connection provides electrical connection between the third and fourth thermoelectric elements, wherein portions of the heat source member are between the first and second electrical connections.

39. A thermoelectric device, comprising:
a heat source member;
a plurality of first thermoelectric elements of only one conductivity type connected to one side of said heat source member;
a plurality of second thermoelectric elements of only a conductivity type opposite to said one conductivity type connected to a side of said heat source member opposite to said one side; and
a plurality of electrical connections in the heat source member wherein each electrical connection provides electrical connection between one of the plurality of first thermoelectric elements and one of the plurality of second thermoelectric elements.

40. The device of claim 39, further comprising:
a first heat sink attached to each of said plurality of first thermoelectric elements; and
a second heat sink attached to each of said plurality of second thermoelectric elements.

41. The device of claim 39, further comprising:
a first metal contact formed on each of said plurality of first thermoelectric elements and connected between each of said plurality of first thermoelectric elements and a respective one of the electrical connections in said heat source member; and
a second metal contact formed on each of said plurality of second thermoelectric elements and connected between each of said plurality of second thermoelectric elements and a respective one of the electrical connections in said heat source member.

42. The device of claim 41, wherein the plurality of electrical connections comprises a plurality of third contacts formed in said heat source member and respectively connected to said first and second metal contacts.

43. The device of claim 41, wherein said first and second metal contacts each comprises a Peltier metal contact.

44. The device of claim 41, further comprising:
a first heat sink attached to each of said plurality of first thermoelectric elements;
a second heat sink attached to each of said plurality of second thermoelectric elements;
a third metal contact formed on each of said plurality of first thermoelectric elements and connected between each of said plurality of first thermoelectric elements and said first heat sink; and a fourth metal contact formed on each of said plurality of second thermoelectric elements and connected between each of said plurality of second thermoelectric elements and said second heat sink.

45. The device of claim 41, wherein:
said first and second thermoelectric elements and said first and second metal contacts are arranged so that a direction of current flow through respective pairs of said first and second thermoelectric elements is substantially the same as a direction of current flow through said first and second metal contacts.

46. The device of claim 39, wherein said first and second thermoelectric elements each comprises one of a bulk element, thin film element and superlattice element.

47. The device of claim 39, wherein said plurality of first and second thermoelectric elements is interconnected in a thermally parallel, electrically series arrangement.

48. The device of claim 39, wherein at least one of said first and second thermoelectric elements comprises one of a bulk element, a thin film element, and a superlattice element.

49. The device of claim 48, wherein said superlattice element comprises at least one of a $Bi_2Te_3/Sb_2Te_3$ superlattice and a Si/Ge superlattice.

50. The device of claim 48, wherein said superlattice element comprises layers of differing thermoelectric materials arranged parallel to the heat source member and having a ZT greater than 1.

51. The device of claim 39, wherein at least one of said first and second thermoelectric elements comprises one of a quantum-well material and a quantum-dot structured material.

52. The device of claim 39, wherein said heat source member is thermally connected to a heat exchanger in at least one of a refrigerating unit and an air conditioning unit.

53. The device of claim 39, wherein said heat source member is thermally connected to a superconducting element.

54. The device of claim 39, wherein said heat source member is thermally connected to at least one of an integrated circuit and a semiconductor power switching device.

55. The device according to claim 39 wherein the electrical connection provides electrical connection through the heat source member.

56. The device according to claim 39 wherein the electrical connection comprises a first electrical connection, the device further comprising:
a second electrical connection in the heat source member wherein the second electrical connection provides electrical connection between a second of the plurality of first thermoelectric elements and a second of the plurality of second thermoelectric elements, wherein portions of the heat source member are between the first and second electrical connections.

57. The device of claim 39, wherein said plurality of first and second thermoelectric elements is interconnected in a thermally parallel, electrically parallel arrangement.

58. A thermoelectric device, comprising:
a heat source member;
a first thermoelectric element of a given conductivity type connected to one side of said heat source member;
a second thermoelectric element of a same conductivity type connected to a side of said heat source member opposite to said one side; and
said first and second thermoelectric elements having an opposite current flow to each other to thereby establish a temperature differential across each of said thermoelectric elements so that the first and second thermoelectric elements define a unipolar transthermistor couple.

59. The device of claim 58, further comprising:
a first heat sink attached to said first thermoelectric element; and
a second heat sink attached to said second thermoelectric element.

60. The device of claim 58, further comprising:
a first metal contact on said first thermoelectric element and connected between said first thermoelectric element and said heat source member; and
a second metal contact on said second thermoelectric element and connected between said second thermoelectric element and said heat source member.

61. The device of claim 60, further comprising:
a third contact in said heat source member and connected to said first metal contact; and
a fourth contact in said heat source member and connected to said second metal contact.

62. The device of claim 60, wherein said first and second metal contacts each comprises a Peltier metal contact.

63. The device of claim 60, further comprising:
a first heat sink attached to said first thermoelectric element;
a second heat sink attached to said second thermoelectric element;
a third metal contact on said first thermoelectric element and connected between said first thermoelectric element and said first heat sink; and
a fourth metal contact on said second thermoelectric element and connected between said second thermoelectric element and said second heat sink.

64. The device of claim 58, wherein said first and second thermoelectric elements each comprises one of a bulk element, thin film element and superlattice element.

65. The device of claim 58, wherein at least one of said first and second thermoelectric elements comprises one of a bulk element, a thin film element, and a superlattice element.

66. The device of claim 65, wherein said superlattice element comprises at least one of a $Bi_2Te_3/Sb_2Te_3$ superlattice and a Si/Ge superlattice.

67. The device of claim 65, wherein said superlattice element comprises layers of differing thermoelectric materials arranged parallel to the heat source member and having a ZT greater than 1.

68. The device of claim 58, wherein at least one of said first and second thermoelectric elements comprises one of a quantum-well material and a quantum-dot structured material.

69. The device of claim 58, wherein said heat source member is thermally connected to a heat exchanger in at least one of a refrigerating unit and an air conditioning unit.

70. The device of claim 58, wherein said heat source member is thermally connected to a superconducting element.

71. The device of claim 58, wherein said heat source member is thermally connected to at least one of an integrated circuit and a semiconductor power switching device.

72. A method of operating a thermoelectric device having first and second thermoelectric elements on opposite sides of a heat source member such that only elements of one conductivity type are on each one of said side and metal contacts between each of said elements and said member, said method comprising:
causing current to flow through respective pairs of said first and second thermoelectric elements in a direction substantially the same as a direction of current flow through said metal contacts so that current flows through at least one electrical connection in the heat source member.

73. The method according to claim 72 wherein current flows through a first electrical connection in the heat source member between thermoelectric elements of a first pair, wherein current flows through a second electrical connection in the heat source member between thermoelectric elements of a second pair, and wherein portions of the heat source member are between the first and second electrical connections.

* * * * *

UNITED STATES PATENT AND TRADEMARK OFFICE
CERTIFICATE OF CORRECTION

| | | |
|---|---|---|
| PATENT NO. | : 7,235,735 B2 | Page 1 of 1 |
| APPLICATION NO. | : 10/413211 | |
| DATED | : June 26, 2007 | |
| INVENTOR(S) | : Venkatasubramanian et al. | |

It is certified that error appears in the above-identified patent and that said Letters Patent is hereby corrected as shown below:

Column 1, Line 23: Please insert:
--STATEMENT OF GOVERNMENT RIGHTS
The U.S. Government has a paid-up license in this invention and the right in limited circumstances to require the patent owner to license others on reasonable terms as provided for by the terms of Navy Contract No. N00014-97-C-0211 awarded by the Office of Naval Research.--

Signed and Sealed this

Seventeenth Day of June, 2008

JON W. DUDAS
*Director of the United States Patent and Trademark Office*